United States Patent [19]
Philippe

[11] Patent Number: 5,323,123
[45] Date of Patent: Jun. 21, 1994

[54] INTEGRATED CIRCUIT HAVING A VARIABLE-GAIN AMPLIFIER

[75] Inventor: Pascal Philippe

[73] Assignee: U.S. Philips Corporation, New York, N.Y.

[21] Appl. No.: 995,099

[22] Filed: Dec. 21, 1992

[30] Foreign Application Priority Data

Dec. 23, 1991 [FR] France .................................. 91 16036

[51] Int. Cl.[5] .......................... H03G 3/30; H04G 1/28
[52] U.S. Cl. ..................................... 330/277; 330/284; 455/333
[58] Field of Search ................. 330/277, 284; 455/323, 455/333, 249.1

[56] References Cited

U.S. PATENT DOCUMENTS 3,873,932  3/1975  Ishigaki et al. ..................... 330/284

FOREIGN PATENT DOCUMENTS 0223287  5/1987  European Pat. Off. .
166706  10/1982  Japan .................................... 455/333

Primary Examiner—James B. Mullins
Attorney, Agent, or Firm—Steven R. Biren

[57] ABSTRACT

An integrated circuit includes a variable-gain amplifier having a first transistor with a load arranged as an inverted and controlled by a first signal of a first frequency, and also having a branch comprising a capacitance in series with a transistor which is arranged as a variable resistance and whose impedance is modulated by a second signal of a second frequency. In this circuit the variable-gain amplifier comprises a second transistor with a load arranged as an inverter and disposed in series with the first transistor and its load between this load and a d.c. supply, in such a manner that the two inverter transistors share the same current, the second inverter being controlled by the output of the first inverter, and the impedance modulated by the second signal is coupled to a node between the load of the first inverter transistor and the second inverter transistor in order to modulate the gain of the latter.

5 Claims, 1 Drawing Sheet

INTEGRATED CIRCUIT HAVING A VARIABLE-GAIN AMPLIFIER

FIELD OF THE INVENTION

The invention relates to an integrated circuit comprising a variable-gain amplifier having a first transistor with a first load arranged as an inverter, which first transistor is controlled by a first signal of a first frequency, and having a branch comprising a capacitance in series with another transistor arranged as a variable resistance, the impedance of said further transistor being modulated by a second signal of a second frequency.

The invention is used for the construction of wireless telephones, mobile receivers and all other receivers requiring low-cost circuits having a low power consumption for use in consumer products. The invention is also used for the construction of all receivers requiring the use of a frequency converter (down-converter), also referred to as a mixer.

BACKGROUND OF THE INVENTION

Such a mixer is known from Patent Application EP 0,223,287. The known circuit comprises a first field-effect transistor having its source connected to ground and having its drain connected to an active load. These elements form an inverter stage powered by a direct voltage applied via the active load. The first transistor receives a first signal of radio frequency on its gate.

Said circuit further comprises a branch formed by another field-effect transistor arranged as a variable resistor in series with a capacitance. This branch is arranged between ground and the drain of the first transistor. The other transistor arranged as a variable resistor is controlled by a signal of a second frequency supplied by a local oscillator. The intermediate-frequency mixing result is available on the drain of the first transistor.

The operation of this circuit is based on modulation of the active load of the first transistor. Thus, mixing is achieved by variation of the gain of the first transistor arranged as a linear amplifier, as a result of the variation of the resistance formed by the other field-effect transistor which is biased to obtain zero volt drain-source voltage and which is arranged in the branch in series with a blocking capacitance between ground and the drain of the first inverter transistor.

The known circuit has several disadvantages. First of all, the isolation of the first signal relative to the second signal is not optimum. Moreover, the isolation of the second signal relative to the output signal is not optimum. Finally, the conversion gain of the circuit is low owing to the use of a single amplifier stage.

It is an object of the present invention to provide a circuit having an improved conversion gain. It is another object of the invention to provide a circuit with an effective isolation between the various signals. However, these advantages should not be at the expense of the power consumption of the circuit. Indeed, for the envisaged use in portable receivers the power consumption should be as low as possible. Therefore, the present invention aims at providing a circuit by means of which the above objects are achieved without an increase in power consumption in comparison with the known circuit.

SUMMARY OF THE INVENTION

Said objects are achieved by means of a circuit of the type defined in the opening paragraph, which is characterized in that the variable-gain amplifier comprises a second transistor with a second load arranged as an inverter, which second transistor and second load are arranged in series with the first transistor and the first load between said first load and a d.c. supply, in such a way that the first and the second transistor share the same current, the second transistor being controlled by the output of the first transistor, and the impedance which is modulated by the second signal is couple to a node between the first load of the first transistor and the second transistor in order to modulate the gain of the second transistor.

Thus, the power consumption is very low because the two inverting amplifier stages share the same current. Moreover, the conversion gain is higher than that of the known circuit because the variable-gain amplifier comprises two stages.

An embodiment of the invention is characterized in that the second frequency is very low in comparison with the first frequency, and the variable-gain amplifier is controlled by the second signal applied to the other transistor arranged as a variable resistor, an output of said amplifier being available on the node between the second transistor and the second load.

Another embodiment of the invention is characterized in that the second frequency is that of a signal from a local oscillator and the first frequency is that of a signal of radio frequency, and the integrated circuit is a frequency converter which supplies a signal of intermediate frequency to the node between the second transistor and the second load.

Thus, the first signal applied to the control electrode of the first inverter transistor is properly isolated from the second signal applied to the control electrode of the transistor arranged as a variable resistor owing to the load of the first inverter.

Moreover, the proper isolation of the signal applied to the control electrode of the transistor arranged as a variable resistor relative to the output signal is achieved by means of the second inverter transistor.

BRIEF DESCRIPTION OF THE DRAWING

The invention will now be described in more detail with reference to the accompanying diagrammatic drawing, in which.

DESCRIPTION OF EMBODIMENTS

Figure 1:
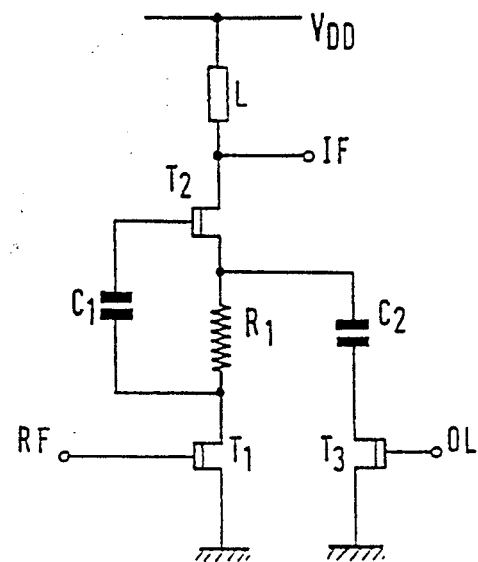
FIG. 1 shows a variable-gain amplifier arrangement arranged as a frequency converter.

In FIG. 1 an integrated circuit comprises a variable-gain amplifier having a first transistor $T_1$ arranged as an inverter. For this purpose the transistor $T_1$ has its drain connected to a load $R_1$, for example a resistive load. The source electrode of the first transistor $T_1$ is connected to ground and its gate or control electrode receives a first signal RF of a first frequency. The variable-gain amplifier comprises a second transistor $T_2$ arranged as an inverter.

To increase the gain of the amplifier without its power consumption being increased the second and the first inverting amplifier stage share the same current. For this purpose the source of the second transistor $T_2$ is connected to that end of the load $R_1$ of the first transistor $T_1$ which is remote from the latter, and the drain of the second transistor $T_2$ is connected to a d.c. supply $V_{DD}$ via a load L. Thus, four successive elements, i.e. the transistor $T_1$, the load $R_1$, the transistor $T_2$ and the load L, are arranged in series between ground and the d.c. supply $V_{DD}$ and share the same current.

The output signal of the first inverting amplifier stage, which signal is available on the drain of the first transistor $T_1$, is applied to the gate or control electrode of the second transistor $T_2$ of the second inverting amplifier stage via a blocking capacitance $C_1$.

The output is available on the drain of the second transistor $T_2$.

The circuit further has a branch comprising a transistor $T_3$ arranged as a variable resistance and a capacitance $C_2$ forming a low impedance and also blocking direct current.

The elements of this branch are arranged in series between ground and the source of the second transistor $T_2$ of the second inverter stage.

The transistor $T_3$, which is arranged as a variable resistance, has one end connected to ground and the other end to the capacitance $C_2$, whose other electrode is connected to the source of the second inverter transistor $T_2$. For direct current the drain-source voltage of the transistor $T_3$ is zero, which is written as $V_{DS}=0$.

In an example using the circuit described above with reference to FIG. 1 the voltage applied to the gate of the transistor $T_3$ is a direct voltage or a slowly variable voltage. This yields a variable-gain amplifier.

In a second example a signal OL of a second frequency generated by a local oscillator is applied to the gate of $T_3$. In this way a mixer or frequency converter is obtained. The mixing result of intermediate frequency $$IF = |RF - OL|$$

is available on the drain of the second inverter transistor $T_2$.

Depending on the voltage applied to the gate of the transistor $T_3$ the impedance of the branch including $T_3$ and $C_2$ in series is reduced or increased. This results in a high or a low gain of the transistor $T_2$.

When the impedance formed by $T_3$ and $C_2$ in series is low the gain G of the circuit is equal to that of the two inverting amplifier stages arranged in cascade, their common sources then being connected to ground via $C_2$ and $T_3$. When the capacitances of the transistors $T_1$ and $T_2$ are ignored the gain G may be expressed by relation (1):

$$G = [-g_{m1}R_1/(1+g_{d1}R_1)] \times [-g_{m2}Z_L/(1+g_{d2}Z_L)] \qquad (1)$$

in which:

$g_{m1}$, $g_{d1}$ are respectively the transconductance and the output conductance of $T_1$, $g_{m2}$, $g_{d2}$ are respectively the transconductance and the conductance of $T_2$, $R_1$ is the impedance of the load $R_1$, $Z_L$ is the impedance of the load L.

When the impedance formed by $C_2$ and $T_3$ in series is high the gain G' of the circuit, when the calculation conditions are the same, is given by relation (2).

$$G' = [-g_{m1}/(g_{d1}+g_{d2}/K)] \times [g_{d2}Z_L/K] \qquad (2)$$

where $$K = 1 + (g_{m2}+g_{d2})R_1 + g_{d2}Z_L$$

If the voltage applied to the gate of $T_3$ is a direct voltage or a slowly variable voltage the gain of the amplifier can be controlled between the values G and G'. Hence the use as a variable-gain amplifier.

If the control signal applied to the gate of $T_3$ is an a.c. signal a mixer having the following advantages is obtained.

The conversion gain is high because the maximum gain G of the circuit when considered as an amplifier is high, i.e. higher than or equal to 20 dB, and because the range of variation of the gain under the influence of the control voltage applied to $T_3$ is substantial, i.e. of the order of 25 dB. The gain is substantially higher than in the known circuit.

As a matter of fact, in the circuit described with reference to FIG. 1 it is the gain of the transistor $T_2$ which is modulated and not a load, as is the case in the prior-art circuit in accordance with EP 0,223,287. This becomes apparent when the two relations G and G' are examined. These relations shows that the gain results from the combination of two terms representing the gain of the first inverter stage and the gain of the second inverter stage respectively. If the impedance of the branch is low the two terms are related by such as expression that G (1) is the gain of the two inverters. If the impedance of the branch is high the gain of the first inverter stage changes slightly and the gain of the second inverter changes substantially, as is apparent from G' (2).

The isolation between the signal OL applied to the gate of the transistor $T_3$ arranged as a variable resistance and the signal RF applied to the gate of the first inverter transistor $T_1$ is substantial. This isolation is provided by the high impedance formed by the series arrangement of the gate-drain capacitance of the first transistor $T_1$ and its load resistance $R_1$. The isolation is therefore better than in the known circuit.

The isolation between the signal OL applied to the gate of $T_3$ and the signal of intermediate frequency IF appearing on the drain of the second inverter transistor $T_2$ is substantial. This is because the transistor $T_2$ does not amplify the signal OL applied to its source electrode. The isolation is therefore better than in the known circuit.

The signal-to-noise ratio of the circuit is very small in contradistinction to that in the known circuit. A small signal-to-noise ratio is obtained because the operation of the transistor $T_1$, when regarded as an amplifier for the first signal RF, is not disturbed by mixing. This transistor $T_1$ operates permanently under low-noise conditions and the signal RF has a constant gain.

The power consumption is low. This is because the transistors $T_1$ and $T_2$ share the same current. The transistor $T_3$, which is arranged as a variable resistance, only consumes the very small current drawn by its gate.

The power gain is high. This parameter particularly distinguishes the circuit in accordance with the invention from the known circuit.

Figure 2:
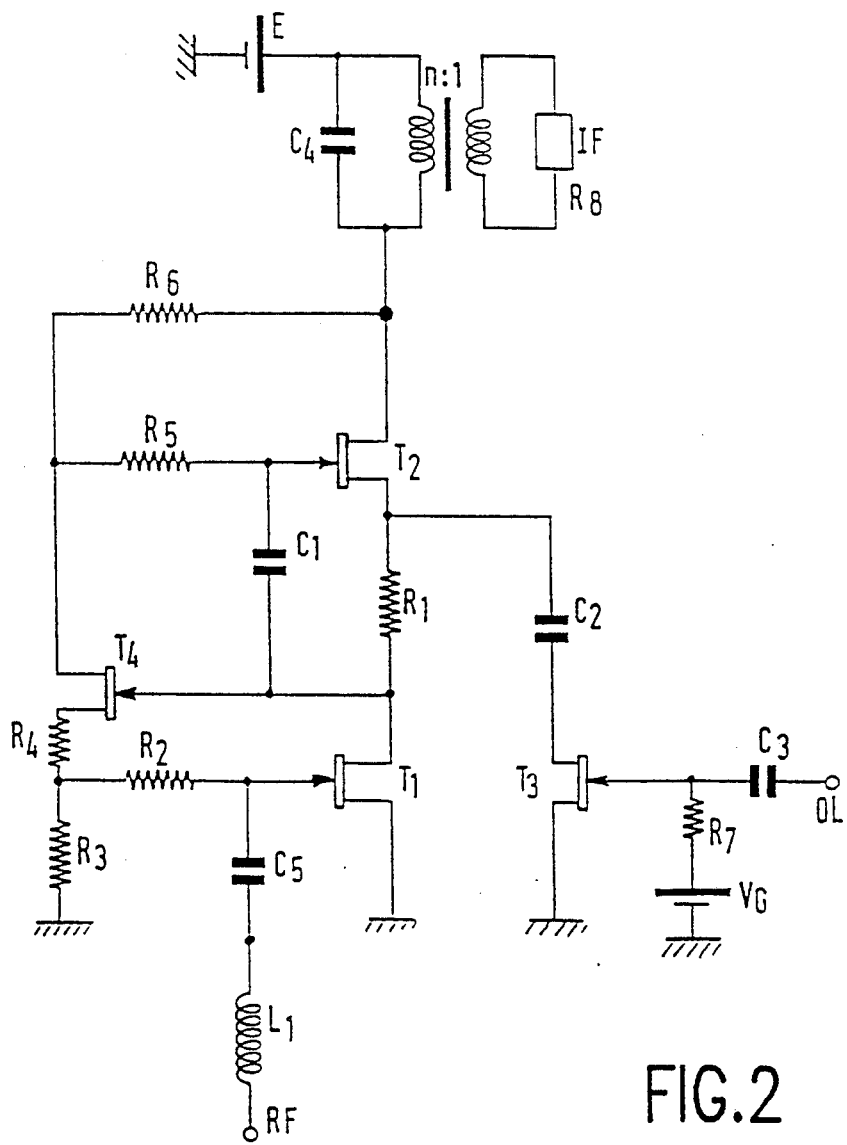
FIG. 2 shows such an arrangement comprising a bias circuit for the gates of the transistors.

FIG. 2 shows an example of the use of the diagrammatic circuit shown in FIG. 1. This circuit is realized by means of gallium arsenide (GaAs) field-effect transistors of the enhancement type, i.e. normally cut off in the absence of a gate-source voltage. The three transistors $T_1$, $T_2$, $T_3$ are of identical dimensions.

The transistors $T_1$ and $T_2$ of the two inverter stages have a gate bias provided by means of the circuit comprising the transistor $T_4$ and the resistor bridge $R_2$, $R_3$, $R_4$ and $R_5$, $R_6$.

The transistor $T_3$ is biased by a second supply voltage $V_G$ via a resistor $R_7$. This supply voltage $V_G$ may be derived from a positive main supply voltage E.

The first signal RF of radio frequency is applied to the gate of the first inverter transistor $T_1$ by means of a circuit comprising an inductance $L_1$ and a capacitance $C_5$, which enables matching to the standard 50 $\Omega$ impedance and d.c. blocking to be achieved.

The second signal OL is applied to the gate of the transistor $T_3$ via the blocking capacitance $C_3$.

The signal IF forming the mixing result is taken from the drain of the second transistor $T_2$ to the primary of an impedance matching transformer tuned to the desired frequency. Tuning is possible by means of the capacitance $C_4$. The signal appears across the Resistor $R_8$ connected to the secondary of the transformer.

This circuit is used in all receivers requiring a low power consumption, a low noise and a satisfactory isolation of the signal OL. Typically, this circuit is employed for the construction of portable transceivers such as portable telephones for use in cellular telephony in the range from 900 MHz to 1800 MHz.

I claim:

1. An integrated circuit comprising a variable-gain amplifier having a first transistor with a first load arranged as an inverter, which first transistor is controlled by a first signal of a first frequency, and having a branch comprising a capacitance in series with a further transistor arranged as a variable resistance, the impedance of said further transistor being modulated by a second signal of a second frequency, characterized in that the variable-gain amplifier comprises a second transistor with a second load arranged as an inverter, which second transistor and second load are arranged, in series with the first transistor and the first load, between said first load and a d.c. supply, such that the first and the second transistor share the same current, the second transistor being controlled by the output of the first transistor, and the impedance which is modulated by the second signal is coupled to a node between the first load of the first transistor and the second transistor in order to modulate the gain of the second transistor.

2. A circuit as claimed in claim 1, characterized in that the second frequency is very low in comparison with the first frequency, and the variable-gain amplifier is controlled by the second signal applied to the further transistor arranged as a variable resistor, an output of said amplifier being available on a node between the second transistor and the second load.

3. A circuit as claimed in claim 1, characterized in that the second frequency is that of a signal from a local oscillator and the first frequency is that of a signal of radio frequency, and the integrated circuit is a frequency converter which supplies a signal of an intermediate frequency to a node between the second transistor and the second load.

4. A circuit as claimed in claim 1, characterized in that said transistors are gallium arsenide field-effect transistors.

5. A circuit as claimed in claim 4, characterized in that the first transistor, the further transistor and the second transistor have identical dimensions and are of the enhancement type.

* * * * *